(12) United States Patent
Huber

(10) Patent No.: US 12,348,207 B1
(45) Date of Patent: Jul. 1, 2025

(54) WIDEBAND TERMINATION NETWORK

(71) Applicant: Keysight Technologies, Inc., Santa Rosa, CA (US)

(72) Inventor: Daniel James Huber, Santa Clara, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 275 days.

(21) Appl. No.: 18/132,870

(22) Filed: Apr. 10, 2023

(51) Int. Cl.
*H03H 11/28* (2006.01)
*H03F 3/04* (2006.01)
*H03M 1/66* (2006.01)

(52) U.S. Cl.
CPC .............. *H03H 11/28* (2013.01); *H03F 3/04* (2013.01); *H03M 1/66* (2013.01)

(58) Field of Classification Search
CPC ............ H03F 3/181; H03F 3/189; H03F 3/04; H03M 1/661; H03H 17/00
USPC ........................................ 341/144, 133, 134
See application file for complete search history.

(56) References Cited

U.S. PATENT DOCUMENTS

| 5,337,090 A | 8/1994 | Ogino et al. |
| 10,862,521 B1* | 12/2020 | Raviprakash ............ H03H 7/25 |
| 2005/0123036 A1* | 6/2005 | Rahman ............. H03H 11/1291 375/240 |

OTHER PUBLICATIONS

Yong Chen et al., "An Area-Efficient and Tunable Bandwidth-Extension Technique for a Wideband CMOS Amplifier Handling 50+ GB/s Signaling", IEEE Transactions on Microwave Theory and Techniques, vol. 65, No. 12, Dec. 2017, pp. 4960-4975.
Sudip Shekhar et al., "Bandwidth Extension Techniques for CMOS Amplifiers", IEEE Journal of Solid-State Circuits, vol. 41, No. 11, Nov. 2006, pp. 2424-2439.
Behzad Razavi, "The Bridged T-Coil—A Circuit for All Seasons", IEEE Solid-State Circuits Magazine, Fall 2015, pp. 9-13.

* cited by examiner

*Primary Examiner* — Peguy Jean Pierre

(57) ABSTRACT

A wideband termination network includes a t-coil, a plurality of output transistors, and a first circuit. The first circuit includes a low-frequency termination resistor that presents a capacitance on a first node; a first inductor that isolates the capacitance on the first node from an output on a second node and that generates a pole-zero cancellation; a high-frequency termination resistor parallel to the first inductor; an adjustable capacitor configured to tune the capacitance on the first node to optimize the pole-zero cancellation; and a second inductor between the second node and a third node and that compensates for capacitance at the second node. The third node is provided between the first circuit and the t-coil.

20 Claims, 5 Drawing Sheets

WIDEBAND TERMINATION NETWORK

BACKGROUND

High speed digital-to-analog converters (DACs) and wideband amplifiers suffer from degraded bandwidth and impedance match at output nodes due to capacitance at the output nodes. Some applications require a wideband frequency response, at least sometimes extending ideally all the way down to direct current (DC). As such, narrowband impedance matching techniques are inappropriate. Several traditional methods are used to compensate for the capacitance at output nodes.

A first traditional method uses a bridged t-coil. A symmetric bridged t-coil includes a center tap Cx, coupled inductors on each side of the center tap Cx, and a bridging capacitor. A circuit with a symmetric bridged t-coil may include a load resistor such as a 50 ohm load resistor, and the symmetric bridged t-coil can absorb capacitance that can be separated from the load resistor, such as that from transistors at the output nodes and electrostatic discharge (ESD) diodes. Symmetric bridged t-coils are used widely, and standard design equations exist for sizing the inductors and bridging capacitor. Compared to a pure resistor-capacitor (RC) circuit, a symmetric bridged t-coil can extend the –3 dB signal bandwidth by more than 250%. The bandwidth of –10 dB return-loss can also be improved and is limited only by inductor parasitics. However, a symmetric bridged t-coil can only perfectly compensate for capacitance at the center tap, $C_x$. This results in two major shortcomings. First, capacitance at the ends of the coil, e.g. from the load resistor, cannot be well compensated with a symmetric bridged t-coil, and this may be particularly problematic when the load resistor must be made large to dissipate high power. Second, if the center-tap loading is not purely capacitive, such as if the center-tap loading includes stray inductance due to wiring parasitics, the center-tap loading cannot be perfectly compensated with a symmetric bridged t-coil using the standard design equations. The error becomes large as the stray inductance approaches a significant fraction of the inductance of the inductors.

A second traditional method involves the use of traveling wave amplifiers (TWAs). Traveling wave amplifiers distribute capacitance into smaller pieces separated with inductors to absorb capacitance of the output transistors into an artificial transmission line. Traveling wave amplifiers can work to even higher frequencies than a symmetric bridged t-coil. The use of traveling wave amplifiers also provides an advantage of spreading out the power dissipation for lower die temperatures, but still does not account for capacitance of the load resistor. Traveling wave amplifiers are also notoriously difficult to design.

A third traditional method involves shunt peaking by placing an inductor in series with the load resistor. When used on-chip in a lumped-circuit fashion, shunt peaking can extend the bandwidth by 183% compared to a pure resistor-capacitor (RC) circuit. But at a 50 Ω output, the signal bandwidth and bandwidth of good impedance match is only extended about 140%. This approach is simple, widely used, and addresses resistor capacitance. But often the bandwidth enhancement is not enough.

More complex inductor networks have been used in high speed monolithic microwave integrated circuit (MMIC) amplifiers to compensate load resistor capacitance. These include conical inductors and multi-stage bias chokes. While good performance can be achieved with the more complex inductor networks, the use of multiple off-chip components makes these approaches bulky and expensive.

SUMMARY

According to an aspect of the present disclosure, a wideband termination network, comprising: a t-coil, a plurality of output transistors, and a first circuit. The t-coil comprises a center tap. The plurality of output transistors are coupled to the center tap of the t-coil. The first circuit includes a low-frequency termination resistor that presents a capacitance on a first node; a first inductor that isolates the capacitance on the first node from an output on a second node and that generates a pole-zero cancellation; a high-frequency termination resistor parallel to the first inductor; an adjustable capacitor configured to tune the capacitance on the first node to optimize the pole-zero cancellation; a second inductor between the second node and a third node and that compensates for capacitance at the second node. The third node is provided between the first circuit and the t-coil.

According to another aspect of the present disclosure, a digital-to-analog-converter includes a digital input; an analog output; and a wideband termination network. The wideband termination network includes a t-coil, a plurality of output transistors, and a first circuit. The t-coil includes a center tap. The plurality of output transistors are coupled to the center tap of the t-coil. The first circuit includes a low-frequency termination resistor that presents a capacitance on a first node; a first inductor that isolates the capacitance on the first node from an output on a second node and that generates a pole-zero cancellation; a high-frequency termination resistor parallel to the first inductor; an adjustable capacitor configured to tune the capacitance on the first node to optimize the pole-zero cancellation; and a second inductor between the second node and a third node and that compensates for capacitance at the second node. The third node is provided between the first circuit and the t-coil.

According to another aspect of the present disclosure, an amplifier includes an input; and a wideband termination network. The wideband termination network includes a t-coil comprising a center tap; a plurality of output transistors coupled to the center tap of the t-coil; and a first circuit. The first circuit includes a low-frequency termination resistor that presents a capacitance on a first node; a first inductor that isolates the capacitance on the first node from an output on a second node and that generates a pole-zero cancellation; a high-frequency termination resistor parallel to the first inductor; an adjustable capacitor configured to tune the capacitance on the first node to optimize the pole-zero cancellation; and a second inductor between the second node and a third node and that compensates for capacitance at the second node. The third node is provided between the first circuit and the t-coil.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
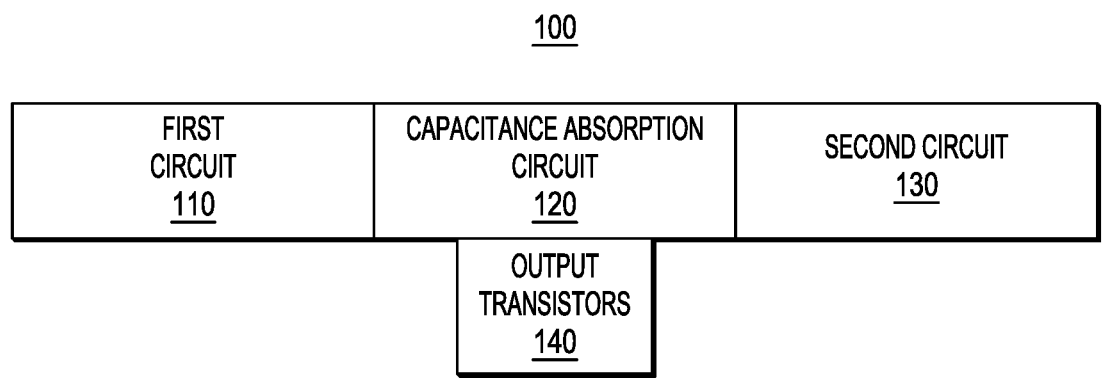
FIG. 1 illustrates a wideband termination network, in accordance with a representative embodiment.

In the following detailed description, for the purposes of explanation and not limitation, representative embodiments disclosing specific details are set forth in order to provide a thorough understanding of embodiments according to the present teachings. However, other embodiments consistent with the present disclosure that depart from specific details disclosed herein remain within the scope of the appended claims. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. Definitions and explanations for terms herein are in addition to the technical and scientific meanings of the terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below.

As described herein, the present teachings relate generally to wideband termination networks that compensates for capacitance of both the output transistors and the load resistor, achieving a comparatively wideband frequency response and impedance match with high output power. In accordance with various representative embodiments, wideband termination networks may also include a so-called high-side current source to reduce power dissipation and provide direct current bias adjustment. The frequency response provided by wideband termination networks may provide good flatness, which is robust to process variations. Wideband termination networks of the various representative embodiments may also account for inevitable wiring parasitics between the t-coil center tap and the output transistors. Among other benefits, the wideband termination networks of the present teachings may also save cost and circuit board area by not requiring any off-chip components.

FIG. 1 illustrates a wideband termination network, in accordance with a representative embodiment.

The wideband termination network 100 in FIG. 1 includes four components, including a first circuit 110, a capacitance absorption circuit 120, a second circuit 130, and output transistors 140.

The first circuit 110 is a wideband impedance circuit that provides a wideband load impedance and includes two termination resistors including a low-frequency termination resistor and a high-frequency termination resistor, a first inductor, a second inductor, and an adjustable capacitor/capacitance. In some embodiments the first circuit may also include a high-side current source. The high-frequency termination resistor may be provided in parallel with the first inductor, and the low-frequency termination resistor may dissipate power from direct current bias currents. A first node may be provided between the low-frequency termination resistor, the adjustable capacitor/capacitance, the parallel high-frequency termination resistor and first inductor and, when present, the high-side current source. A second node may be provided between the second inductor and the parallel high-frequency termination resistor and first inductor. A third node may be provided between the second inductor and the capacitance absorption circuit 120. The low-frequency termination resistor may present a large capacitance on the first node. An example of the first circuit is illustrated by the first circuit 210 in FIG. 2, as described below.

The capacitance absorption circuit 120 may include a symmetric bridged t-coil with a bridging capacitor, and two inductors on each side of the center-tap. The symmetric bridged t-coil is provided between the third node and a fourth node, wherein the third node is between the second inductor and the symmetric bridged t-coil, and the fourth node is between the symmetric bridged t-coil and the second circuit 130.

The second circuit 130 includes electrostatic discharge (ESD) diodes and inductors. Capacitance of the electrostatic discharge diodes is compensated with the inductors.

The output transistors 140 includes transistors which are used to provide output from the wideband termination network 100. The symmetric bridged t-coil of the capacitance absorption circuit 120 is used to compensate for capacitance of the output transistors. The output transistors 140 may be provided with another inductor used to account for wiring parasitics. The added inductor may account for stray inductance at the center-tap of the capacitance absorption circuit 120.

Figure 2:
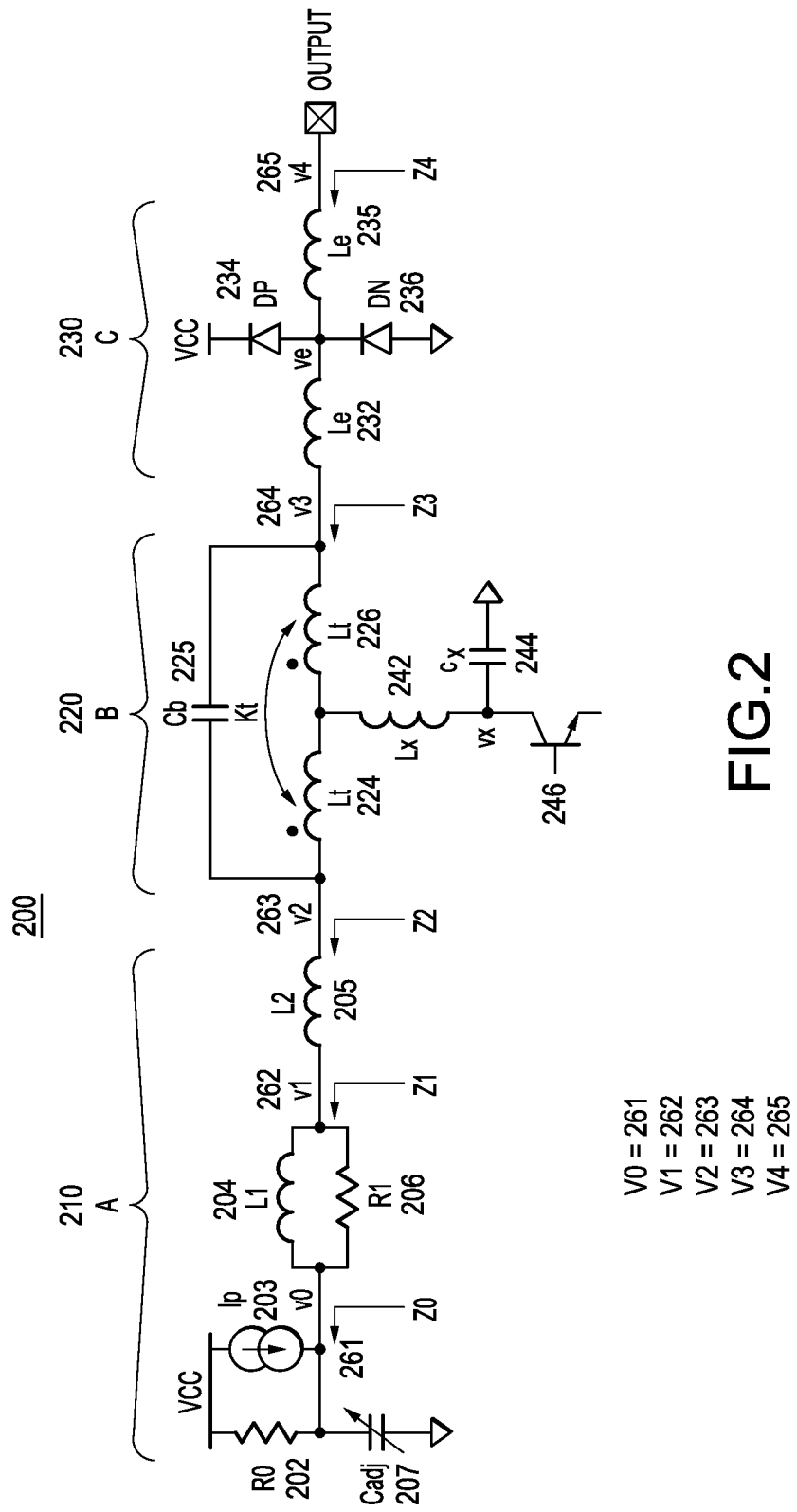
FIG. 2 illustrates a wideband termination network, in accordance with a representative embodiment.

FIG. 2 illustrates a wideband termination network, in accordance with a representative embodiment.

In FIG. 2, a wideband termination network 200 includes components shown in three sections includes a first circuit 210, a capacitance absorption circuit 220, and a second circuit 230. Output transistors are shown below the capacitance absorption circuit 220. The wideband termination network 200 is an example of the wideband termination network 100, and may be implemented in a binary complementary metal-oxide-semiconductor (BiCMOS) process which integrates complementary metal-oxide-semiconductor (CMOS) technology with bipolar junction transistor technology. The wideband termination network 200 may be implemented on a single chip without requiring off chip components. Notably, the implementation in BiCMOS is merely illustrative. The various representative embodiments are contemplated to be implemented in CMOS technology. Just by way of illustration, implementation in CMOS may be desirable to provide low power dissipation, large noise margins and greater packing density than BiCMOS implementations of the present teachings.

The first circuit 210 is again a wideband impedance circuit that provides a wideband load impedance and includes a low-frequency termination resistor 202, a high-side current source 203, a first inductor 204, a high-frequency termination resistor 206, a second inductor 205 and a adjustable capacitor 207. Capacitance from the low-frequency termination resistor 202 and the high-frequency termination resistor 206 is compensated for by the inductor 204. Additionally, use of the adjustable capacitor 207 makes the wideband termination network 200 tunable, so that a relatively flat frequency response may be obtained even in the presence of process mismatches.

The low-frequency termination resistor 202 is labelled R0 and may nominally comprise a 50 ohm resistor but may provide a resistance lower than the nominal value by a few ohms to account for DC resistance of the first inductor 204 and the second inductor 205. Direct current bias current flows in the low-frequency termination resistor 202 so that the power dissipated by the low-frequency termination resistor is relatively high. As such, the low-frequency termination resistor 202 may be relatively large and presents a relatively large capacitance on node v0. In the BiCMOS implementation, a P+ unsilicided polysilicon resistor may be used for the low-frequency termination resistor 202 labelled R0. The P+ unsilicided polysilicon resistor may be manufactured by blocking or omitting a silicided implant insofar as the silicided implant that would lower the resistance.

The high-side current source 203 is labelled Ip and may be optional. The high-side current source 203 may be used to absorb some fraction of the direct current bias current, and this is particularly beneficial when a relatively high power is used for the wideband termination network 200. The absorption of the direct current bias current by the high-side current source 203 may lower the DC voltage drop across the low-frequency termination resistor 202 labelled as R0, reducing power dissipation and the supply voltage VCC. The high-side current source 203 allows adjustment of the output DC voltage independent of VCC. Since the low-frequency termination resistor 202 labelled as R0 carries less bias current, resistor 202 may be made physically smaller with less capacitance. Nevertheless, the capacitance of the high-side current source 203 labelled Ip is typically larger than that of the low-frequency termination resistor labeled R0, so including the high-side current source 203 increases the total capacitance at node v0. In the BiCMOS implementation, a 2.5V PMOS device is used for the high-side current source 203 labelled as Ip.

The high-frequency termination resistor 206 is labelled R1 and may nominally comprise a 50 ohm resistor. Since the high-frequency termination resistor 206 is in parallel with an the first inductor 204, the high-frequency termination resistor 206 does not carry significant direct current bias current and can be made much smaller than the low-frequency termination resistor 202 labelled as R0. In the BiCMOS implementation, a P+ unsilicided polysilicon resistor may be used for the high-frequency termination resistor 206. The P+ unsilicided polysilicon resistor may be manufactured by blocking or omitting a silicided implant insofar as the silicided implant that would lower the resistance.

The first inductor 204 isolates the large capacitance at v0 from the high frequency output. The optimal value for the first inductor 204 is $R^2C0$, where C0 is the total capacitance at node v0 and R is the characteristic impedance of 50 ohms. At the 50 ohm value, a pole-zero cancellation occurs, and the impedance Z1 looking into node v1 should be 50 ohms at all frequencies. In reality the impedance Z1 is not always 50 ohms due to the capacitance at node v1. Most of the capacitance at node v1 comes from the first inductor 204, which is typically a large inductor. This capacitance causes Z1 to have a significant negative reactance at high frequency, degrading the match. But this degradation occurs at much higher frequency than it would without the first inductor 204 and the high-frequency termination resistor 206. In the BiCMOS implementation, the first inductor 204 may comprise an 8-turn square spiral inductor in top metal, with a diameter of 96 μm after shrink, a nominal value of 4 nH, and a parasitic capacitance presented to node v1 of approximately 20 fF.

The adjustable capacitor 207 is labelled Cadj and is used to tune capacitance on the first node v0 for the best pole-zero cancellation. Process variation may cause the low-frequency termination resistor 202 and the high-frequency termination resistor 206 and parasitic capacitance presented by the high-side current source 203 to deviate significantly from their nominal values. The first inductor 204 may also be off from its nominal value due to modeling inaccuracies. The adjustable capacitor 207 is tunable so that the first circuit 210 can achieve the nominal targets even when components vary from the nominal values.

At low frequency, a capacitor is an open circuit and an inductor is a short circuit. At high frequency, the capacitor is a short circuit and the inductor is an open circuit. The first circuit 210 transitions smoothly at frequencies between the low frequency and the high frequency and presents a uniform impedance (e.g., of 50 ohms) at all frequencies. This is accomplished using the adjustable capacitor 207. The adjustable capacitor 207 may be implemented with 20 units of 50 fF MIM capacitors, with a 1V PMOS switch on the ground side of the adjustable capacitor 207. Total capacitance at the first node v0 may be approximately 1.6 pF and the crossover frequency may be around 2 GHz. The adjustable capacitor 207 allows changing capacitance at the first node v0 by approximately ±500 fF, which is enough to maintain flat frequency response near the crossover frequency over simulated process corner variations.

The second inductor 205 may be a relatively small inductor labelled L2. The second inductor is used to compensate for the capacitance at the second node v1. The second inductor 205 has a positive reactance and is sized so that the positive reactance cancels the negative reactance of Z1 at the highest frequency of interest. The sizing to cancel the negative reactance of Z1 does not affect output bandwidth much, but it does improve the impedance match significantly. The value of the second inductor 205 can be relatively quite small. For example, in the BiCMOS implementation, the desired value of the second inductor 205 is 60 pH, to compensate −15Ω Z1 reactance at 40 GHz. The second inductor 205 may be implemented with a 180 µm length of 68Ω transmission line, which provides more layout flexibility and better power grid integrity than a spiral inductor. Use and placement of the second inductor 205 also helps lower die temperatures, by getting the power dissipation of the low-frequency terminating resistor 202 and the high-side current source 203 further away from the output transistors.

The low-frequency termination resistor 202, the high-side current source 203, the first inductor 204, the high-frequency termination resistor 206, the second inductor 205 and the adjustable capacitor 207 may be sized so that a 50 ohm impedance appears at all frequencies. As a result, the first circuit 210 may be configured to result in a pole zero cancellation.

Figure 3:
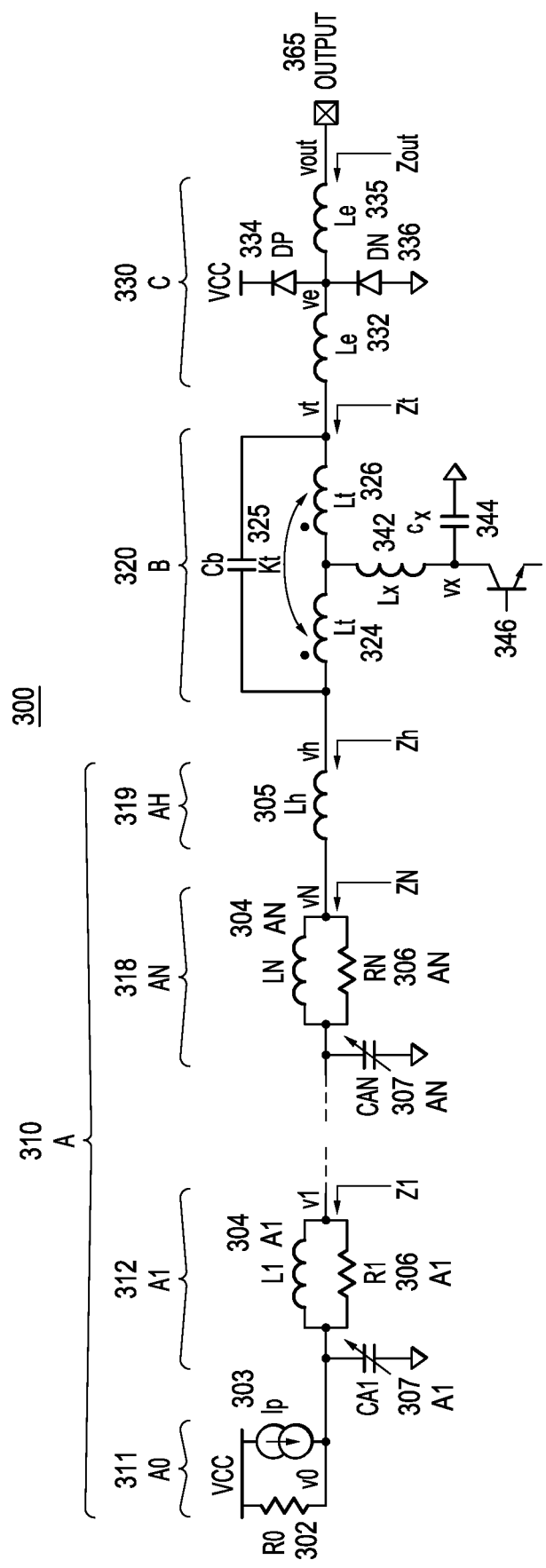
FIG. 3 illustrates a wideband termination network, in accordance with a representative embodiment.
Figure 4:
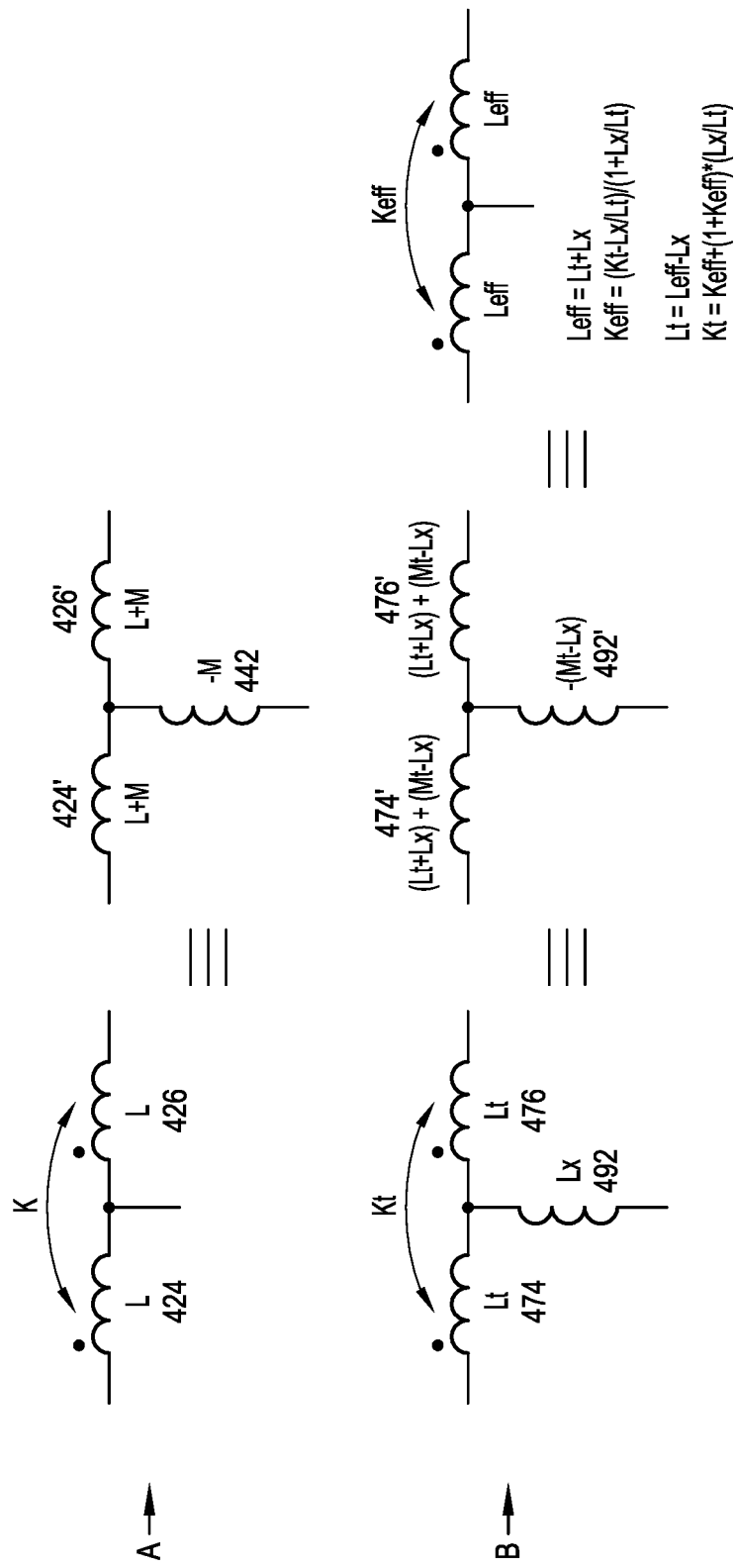
FIG. 4 illustrates center-tap inductance absorption in a wideband termination network, in accordance with another representative embodiment.

The capacitance absorption circuit 220 includes a symmetric bridged t-coil. The symmetric bridged t-coil includes a capacitor 225, and a first absorption inductor 224 and a second absorption inductor 226 on either side of the center-tap. The capacitance absorption circuit 220 is used to compensate for the capacitance of the output transistors at the output node vx. The capacitance at the output node vx is labeled as Cx at the capacitor 244 in FIG. 2. An output inductor 242 is provided between the t-coil and the output transistors and is labeled Lx. The output inductor 242 is provided to account for wiring parasitics. Often, layout around the output transistors is dense, and it is not practical to place the t-coil immediately adjacent to these output transistors. FIG. 4 shows how the wire inductance can be absorbed into an equivalent symmetric t-coil, allowing the traditional t-coil design equations to be used. FIG. 3 is described below. A transmission-line implementation is used for the t-coil in FIG. 2, similar to L1. Compared to a spiral inductor, the transmission-line implementation gives better power grid integrity around the output transistors at the cost of larger parasitic capacitance. The transmission-line t-coil implemented in FIG. 2 has Lt=230 pH and Kt=0.38 at 10 GHz, with a total capacitance to ground of 70 fF. This corresponds to an effective t-coil of Leff=290 pH and Keff=0.09, which is appropriate to compensate a total capacitance of 255 fF at the capacitor 244 plus 70 fF from the t-coil.

The first ESD protection diode DP 234 and the second ESD protection diode DN 236 is compensated in travelling wave amplifier fashion with a fifth inductor 232 and a sixth inductor 235, both labelled Le. In the BiCMOS implementation, the first ESD protection diode DP 234 and the second ESD protection diode DN 236 are sized for only 250V human body model (HBM) protection, which is considered minimal. This keeps the capacitance at node ve small, only 20 fF, and allows the inductors to be implemented with short lengths of high impedance transmission line. Node v3 164 and node v4 265 have a relatively good impedance match, so arbitrary lengths of 50 ohm transmission line may be inserted here as needed. Typically the first ESD protection diode DP 234 and the second ESD protection diode DN 236 are placed as close to the output as possible for best protection, and most of the required routing between transistors and output pads is provided at node v3 264.

The wideband termination network 200 in FIG. 2 is visualizable as three separate parts. However, a termination network described herein is not limited to the three separate parts as shown, and instead may include fewer or more than the three separate parts as shown. In the first part labeled A in FIG. 2, a wideband 50 ohm load impedance is formed. In the second part labeled B in FIG. 2, capacitance of the output transistors is absorbed by accounting for stray inductance at the center-tap. I the third part labeled C in FIG. 2, capacitance of the ESD diodes is absorbed.

A variety of variations to FIG. 2 may be provided in alternative embodiments. For example, a travelling wave amplifier structure may be used instead of a t-coil in the second part labeled B. As another example, when larger ESD diodes are required, a bridged t-coil may be used instead of the Le inductors in the third part labeled C. As yet another example which involves merging functions of the second part labeled B and the third part labeled C, the ESD diodes may be placed at node vx, in which case the capacitance of the ESD diodes is lumped into Cx.

FIG. 3 illustrates a wideband termination network, in accordance with a representative embodiment.

In FIG. 3, a wideband termination network 300 again includes components shown in three sections including a first circuit 310, a capacitance absorption circuit 320, and a second circuit 330. The first circuit 310 is again a wideband impedance circuit, and output transistors are again shown below the capacitance absorption circuit 320. The first circuit 310 of the wideband termination network 300 in FIG. 3 includes multiple stages. An initial stage 311 is labeled A0 and includes a low-frequency termination resistor R0 and a high-side current source Ip. A final inductance stage 319 is labeled AH and includes a third inductor Lh.

Whereas in FIG. 2 the first stage 210 is a complete wideband impedance stage, in FIG. 3, a multi-stage termination network is included as a multi-stage wideband termination network between the initial stage 311 and the final inductance stage 319. The multi-stage termination network in FIG. 3 may include two or more stages each with an inductor, a resistor and a tunable capacitor. The number of stages of the multi-stage termination network is not particularly limited. The multiple stages of the multi-stage termination network shown in FIG. 3 include a first stage 312 labelled A1 through an nth stage 318 labeled AN. In practice, the inductors and capacitors of the stages of the multi-stage termination network in FIG. 3 get smaller from left to right.

In FIG. 3, the wideband termination network 300 again includes components shown in three sections including the first circuit 310, the capacitance absorption circuit 320, and the second circuit 330. Output transistors are shown below the capacitance absorption circuit 320. The wideband termination network 300 is an example of the wideband termination network 100, and may be implemented in a BiCMOS process which integrates CMOS technology with bipolar junction transistor technology. The wideband termination network 300 may be implemented on a single chip without requiring off chip components.

The first circuit 310 includes a low-frequency termination resistor 302 and a high-side current source 303 in the first section labelled A0. In the first stage 312 labelled A1, the first circuit 310 also includes a first inductor 304A1 and a first high-frequency termination resistor 306A1 in parallel, along with a first adjustable capacitor 307A1. In the nth stage 318 labeled AN, the first circuit 310 also includes a second inductor 304AN and a second high-frequency termination resistor 306AN in parallel, along with a second adjustable capacitor 307AN. The first circuit 310 also includes a third inductor 305 in the final inductance stage 319 labeled AH.

In FIG. 3, capacitance from the low-frequency termination resistor 302 and the high side current source 303 and the first high-frequency termination resistor 306A1 is compensated for by inductor 304A1. Additionally, use of the first adjustable capacitor 307A1 makes this compensation tunable, so that a relatively flat frequency response may be obtained even in the presence of process mismatches.

The low-frequency termination resistor 302 is labelled R0 and may nominally comprise a 50 ohm resistor but may provide a resistance lower than the nominal value by a few ohms to account for DC resistance of the first inductor 304A1, the second inductor 304AN and the third inductor 305. Direct current bias current flows in the low-frequency termination resistor 302 so that the power dissipated by the low-frequency termination resistor is relatively high. As such, the low-frequency termination resistor 302 may be relatively large and again presents a relatively large capacitance on node v0. In the BiCMOS implementation, a P+ unsilicided polysilicon resistor may be used for the low-frequency termination resistor 302 labelled R0. The P+ unsilicided polysilicon resistor may be manufactured by blocking or omitting a silicided implant insofar as the silicided implant that would lower the resistance.

The high-side current source 303 is again labelled Ip and may be optional. The high-side current source 303 may be used to absorb some fraction of the direct current bias current, and this is particularly beneficial when a relatively high power is used for the wideband termination network 300. The absorption of the direct current bias current by the high-side current source 303 may lower the DC voltage drop across the low-frequency termination resistor 302 labelled as R0, reducing power dissipation and the supply voltage VCC. The high-side current source 303 allows adjustment of the output DC voltage independent of VCC. As will be appreciated by one of ordinary skill in the art having the benefit of the present disclosure, because the low-frequency termination resistor 302 labelled as R0 carries less bias current, resistor 302 may be made comparatively physically smaller with less capacitance. Nevertheless, the capacitance of the high-side current source 303 labelled Ip is typically larger than that of the low-frequency termination resistor labeled R0, so including the high-side current source 303 increases the total capacitance at node v0. In the BiCMOS implementation, a 2.5V PMOS device may be used for the high-side current source 303 labelled as Ip.

The first high-frequency termination resistor 306A1 is labelled R1 and may nominally comprise a 50 ohm resistor. Similarly, the Nth high-frequency termination resistor 306AN is labelled RN and may nominally comprise a 50 ohm resistor. Since the first high-frequency termination resistor 306A1 is in parallel with an the first inductor 304A1, the first high-frequency termination resistor 306A1 does not carry significant Direct current bias current and can be made much smaller than the low-frequency termination resistor 302. Similarly, since the second high-frequency termination resistor 306AN is in parallel with the second inductor 304AN, the second high-frequency termination resistor 306AN does not carry significant Direct current bias current and can be made much smaller than the low-frequency termination resistor 302. In the BiCMOS implementation, a P+ unsilicided polysilicon resistor may be used for each of the first high-frequency termination resistor 306A1 and the second high-frequency termination resistor 306AN. The P+ unsilicided polysilicon resistor may be manufactured by blocking or omitting a silicided implant insofar as the silicided implant that would lower the resistance.

The first inductor 304A1 isolates the large capacitance at v0 from the high frequency output. The optimal value for the first inductor 304A1 is R2C0, where C0 is the total capacitance at node v0, and R is the characteristic impedance of 50Ω. At the 50Ω value, a pole-zero cancellation occurs, and the impedance Z1 looking into node v1 should be 50Ω at all frequencies. In reality, the impedance Z1 deviates from 50Ω at high frequency due to the capacitance at node v1, which will be smaller than C0, but may still be provide a measureable capacitance. Most of the capacitance at node v1 is caused by the first inductor 304A1, which is typically a large inductor. The capacitance at node v1 may be isolated in the same way as the capacitance at node v0, with another stage A2. A beneficial value for the inductor 304A2 in stage A2 is $R^2C1$, where C1 is the total capacitance at node v1. Since C1 may be smaller than C0, inductor 304A2 may be smaller than inductor 304A1, with a correspondingly smaller capacitance. The process of adding stages may be repeated, until the capacitance presented by the final Nth stage AN is small enough. At each stage, the optimal value for inductor 304AN is R2C(N−1), where C(N−1) is the total capacitance at node v(N−1) and R is the characteristic impedance of 50Ω. After stage AN, an optional final inductor 305 may be inserted to compensate the capacitance at node vN. Inductor 305 is sized so that its positive reactance compensates the negative reactance of impedance ZN looking into node vN at the highest frequency of interest. In an example two-stage BiCMOS implementation, inductor 304A1 may comprise a 9-turn square spiral inductor in top metal, with a diameter of 102 μm after shrink and a nominal value of 6 nH. The second inductor 304AN may comprise a 4-turn square inductor in top metal, with a diameter of 53 μm after shrink and a nominal value of 600 pH.

The first adjustable capacitor 307A1 and the second adjustable capacitor 307AN are used to tune capacitance on the first node v0 and on the second node vN for improved pole-zero cancellations. Insofar as process variation may cause the resistors, inductors and the high-side current source 303 to be significantly off from their nominal values, the adjustable capacitors are tunable so that the first circuit 310 can achieve the nominal targets even when components vary from the nominal values. The first adjustable capacitor 307A1 may be implemented with 32 units of 72 fF MIM capacitors, with a 1V PMOS switch on the ground side of each of the adjustable capacitors. The adjustable capacitor 307AN may be implemented with 64 units of 4.6 fF metal-oxide-metal (MOM) capacitors, with a 1V PMOS switch on the ground side of each of the adjustable capacitors.

The descriptions of the adjustable capacitor 207 in FIG. 2 may otherwise be applicable to both of the first adjustable capacitor 307A1 and the second adjustable capacitor 307AN in FIG. 3, and therefore are not repeated in detail. The same is true also for the third inductor 305, the capacitance absorption circuit 320 including the elements of the a symmetric bridged t-coil, including the fourth first absorption inductor 324 and the fifth absorption inductor 326 and the capacitor 325, the capacitance at the output node vx labeled as Cx at the capacitor 344, the transistor(s) 346, and the output inductor 342. The same is moreover true for the first ESD protection diode DP 334 and the second ESD protection diode DN 336, along with the seventh inductor 332 and the eight inductor 335.

A variety of variations to FIG. 3 may again be provided in alternative embodiments. For example, a travelling wave amplifier structure may be used instead of a t-coil in the second part labeled B. As another example, when larger ESD diodes are required, a bridged t-coil may be used instead of the Le inductors in the third part labeled C. As yet another example which involves merging functions of the second part labeled B and the third part labeled C, the ESD diodes may be placed at node vx, in which case the capacitance of the ESD diodes is lumped into Cx.

FIG. 4 illustrates center-tap inductance absorption in a wideband termination network, in accordance with another representative embodiment.

FIG. 4 shows how the wire inductance can be absorbed into an equivalent symmetric t-coil, allowing the traditional t-coil design equations to be used. To first order, the wire capacitance may be lumped in with Cx. The equations in FIG. 4 show that for a desired Ke and Le, the presence of Lx means the actual t-coil inductance Lt must be smaller, with a higher coupling coefficient Kt. In the BiCMOS implementation, the route between output transistors and the t-coil may be 130 um, with an inductance of 60 pH and a capacitance of 13 fF. Total Cx may be 185 fF, including the Lx wire.

Figure 5A:
FIG. 5A illustrates a digital-to-analog converter with a wideband termination network, in accordance with a representative embodiment.

FIG. 5A illustrates a digital-to-analog converter with a wideband termination network, in accordance with a representative embodiment.

In FIG. 5A, a digital-to-analog converter 500A includes a digital input 501, the wideband termination network 200 from FIG. 2, and an analog output 599. In other embodiments, the wideband termination network 300 from FIG. 3 may be used to implement the digital-to-analog converter 500A. The digital-to-analog converter 500A may include additional elements such as switches, additional resistors, one or more operational amplifier, and other types of circuit elements found in digital-to-analog converters.

Figure 5B:
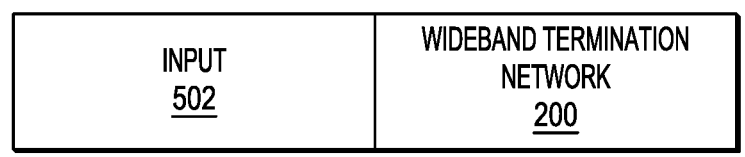
FIG. 5B illustrates an amplifier with a wideband termination network, in accordance with a representative embodiment.

FIG. 5B illustrates an amplifier with a wideband termination network, in accordance with a representative embodiment.

In FIG. 5B, an amplifier 500B includes an input 502 and the wideband termination network 200 from FIG. 2. In other embodiments, the wideband termination network 300 from FIG. 3 may be used to implement the digital-to-analog converter 500A. The amplifier 500B may include additional elements such as types of circuit elements found in amplifiers.

The various wideband termination networks described herein may be used to lower cost, lower complexity, and simplify design compared to previous monolithic microwave integrated circuit (MMIC) solutions. Additionally, the various wideband termination networks described herein may provide for wider bandwidth operations compared to previous fully-integrated solutions. As another improvement provided by the various wideband termination networks described herein, crossover between low and high frequency response may be made tunable, to accommodate process variations. The crossover refers to transitions between high frequency termination and low frequency termination, so that it looks like resistance is maintained at 50 ohms through frequency changes. In an embodiment, dedicated hardware implementations, such as application-specific integrated circuits (ASICs), field programmable gate arrays (FPGAs), programmable logic arrays and other hardware components, are constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing may implement one or more of the methods or functionalities as described herein, and a processor described herein may be used to support a virtual processing environment.

Accordingly, wideband termination networks described herein may compensates for capacitance of both the output transistors and the load resistor, achieving a wideband frequency response and impedance match with high output power. Wideband termination networks may also include a high-side current source to reduce power dissipation and provide direct current bias adjustment. The frequency response provided by wideband termination networks may have good flatness, which is robust to process variations. Wideband termination networks may also account for inevitable wiring parasitics between the t-coil center tap and the output transistors. Wideband termination networks may moreover save cost and circuit board area by not requiring any off-chip components.

Although the wideband termination networks described herein have been described with reference to several exemplary embodiments, it is understood that the words that have been used are words of description and illustration, rather than words of limitation. Changes may be made within the purview of the appended claims, as presently stated and as amended, without departing from the scope and spirit of the wideband termination networks in their aspects. Although the wideband termination networks described herein have been described with reference to particular means, materials and embodiments, the descriptions of such wideband termination networks are not intended to be limited to the particulars disclosed; rather the teachings of wideband terminations networks herein extend to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

I claim:

1. A wideband termination network, comprising:
   a t-coil comprising a center tap;
   a plurality of output transistors coupled to the center tap of the t-coil; and
   a first circuit comprising:
      a low-frequency termination resistor that presents a capacitance on a first node;
      a first inductor that isolates the capacitance on the first node from an output on a second node and that generates a pole-zero cancellation;
      a high-frequency termination resistor parallel to the first inductor;
      an adjustable capacitor configured to tune the capacitance on the first node to optimize the pole-zero cancellation; and
      a second inductor between the second node and a third node and that compensates for capacitance at the second node, wherein the third node is provided between the first circuit and the t-coil.

2. The wideband termination network of claim 1, further comprising:
   a second circuit comprising:
      a first protection diode and a second protection diode; and
      a first inductor and a second inductor that compensate for capacitance of the first protection diode and the second protection diode, wherein a fourth node is provided between the t-coil and the second circuit.

3. The wideband termination network of claim 2, wherein the wideband termination network is configured to absorb capacitance of the first inductor and the second inductor.

4. The wideband termination network of claim 2, further comprising:
   a third inductor between the t-coil and the output transistors to account for wiring parasitics.

5. The wideband termination network of claim 1, wherein the wideband termination network is implemented in a digital-to-analog converter.

6. The wideband termination network of claim 1, wherein the wideband termination network is implemented in an amplifier.

7. The wideband termination network of claim 1, further comprising:
   a high-side current source configured to absorb part of a direct current bias current to lower a DC voltage drop across the low-frequency termination resistor, wherein the high-side current source increases total capacitance at the first node v0.

8. The wideband termination network of claim 1, wherein the first circuit forms a wideband load impedance.

9. The wideband termination network of claim 1, wherein the wideband termination network is configured to absorb capacitance of the output transistors.

10. The wideband termination network of claim 1, wherein the first circuit comprises a single stage in a multi-stage configuration wideband termination network connected to the third node.

11. A digital-to-analog converter, comprising:
    a digital input;
    an analog output; and
    a wideband termination network, comprising:
    a t-coil comprising a center tap;
    a plurality of output transistors coupled to the center tap of the t-coil; and
    a first circuit comprising:
       a low-frequency termination resistor that presents a capacitance on a first node;
       a first inductor that isolates the capacitance on the first node from an output on a second node and that generates a pole-zero cancellation;
       a high-frequency termination resistor parallel to the first inductor;
       an adjustable capacitor configured to tune the capacitance on the first node to optimize the pole-zero cancellation; and
       a second inductor between the second node and a third node and that compensates for capacitance at the second node, wherein the third node is provided between the first circuit and the t-coil.

12. The digital-to-analog converter of claim 11, further comprising:
    a second circuit comprising:
       a first protection diode and a second protection diode; and
       a first inductor and a second inductor that compensate for capacitance of the first protection diode and the second protection diode, wherein a fourth node is provided between the t-coil and the second circuit.

13. The digital-to-analog converter of claim 12, wherein the wideband termination network is configured to absorb capacitance of the first inductor and the second inductor.

14. The digital-to-analog converter of claim 12, further comprising:
    a third inductor between the t-coil and the output transistors to account for wiring parasitics.

15. The digital-to-analog converter of claim 11, wherein the wideband termination network is implemented in a digital-to-analog converter.

16. The digital-to-analog converter of claim 11, further comprising:
   a high-side current source configured to absorb part of a direct current bias current to lower a DC voltage drop across the low-frequency termination resistor, wherein the high-side current source increases total capacitance at the first node v0.

17. An amplifier, comprising:
an input; and
a wideband termination network, comprising:
   a t-coil comprising a center tap;
   a plurality of output transistors coupled to the center tap of the t-coil; and
   a first circuit comprising:
      a low-frequency termination resistor that presents a capacitance on a first node;
      a first inductor that isolates the capacitance on the first node from an output on a second node and that generates a pole-zero cancellation;
      a high-frequency termination resistor parallel to the first inductor;
      an adjustable capacitor configured to tune the capacitance on the first node to optimize the pole-zero cancellation; and
      a second inductor between the second node and a third node and that compensates for capacitance at the second node, wherein the third node is provided between the first circuit and the t-coil.

18. The amplifier of claim 17, further comprising:
a second circuit comprising:
   a first protection diode and a second protection diode; and
   a first inductor and a second inductor that compensate for capacitance of the first protection diode and the second protection diode, wherein a fourth node is provided between the t-coil and the second circuit.

19. The amplifier of claim 18, wherein the wideband termination network is configured to absorb capacitance of the first inductor and the second inductor.

20. The amplifier of claim 18, further comprising:
   a high-side current source configured to absorb part of a direct current bias current to lower a DC voltage drop across the low-frequency termination resistor, wherein the high-side current source increases total capacitance at the first node v0.

* * * * *